United States Patent [19]

Allen, Jr. et al.

[11] 4,393,393

[45] Jul. 12, 1983

[54] LASER DIODE WITH DOUBLE SIDED HEAT SINK

[75] Inventors: Louis B. Allen, Jr., Florissant; Herbert G. Koenig, Jr., St. Charles; Robert A. Stacy, Chesterfield; Danny D. Meyer, St. Louis, all of Mo.

[73] Assignee: McDonnell Douglas Corporation, Long Beach, Calif.

[21] Appl. No.: 261,832

[22] Filed: May 8, 1981

Related U.S. Application Data

[63] Continuation of Ser. No. 65,918, Aug. 13, 1979, abandoned.

[51] Int. Cl.³ .................. H01L 23/02; H01L 23/48; H01L 29/44
[52] U.S. Cl. .................................. 357/81; 357/82; 357/68
[58] Field of Search .................. 357/12, 81, 82, 79, 357/68

[56] References Cited

U.S. PATENT DOCUMENTS

| | | | |
|---|---|---|---|
| 3,245,002 | 4/1966 | Hall | 357/12 |
| 3,303,432 | 2/1967 | Garfinkel et al. | 357/81 |
| 3,351,698 | 11/1967 | Marinace | 357/81 |
| 3,428,845 | 2/1969 | Nelson | 357/81 |
| 3,614,550 | 10/1971 | Marinace | 357/81 |
| 3,711,789 | 1/1973 | Dierschke | 357/82 |
| 3,771,031 | 11/1973 | Kay | 357/81 |
| 4,024,570 | 5/1977 | Hartmann et al. | 357/81 |
| 4,097,891 | 6/1978 | Selway et al. | 357/81 |
| 4,315,225 | 2/1982 | Allen et al. | 357/81 |

Primary Examiner—Andrew J. James
Attorney, Agent, or Firm—Goerge W. Finch; Donald L. Royer; John P. Scholl

[57] ABSTRACT

A laser diode is soldered between metal plates for intimate thermal and electrical contact. The plates are prefabricated and are provided with an insulative spacer therebetween. The two metal plates are held together in a preferred orientation by the spacer which is firmly adhered and sealed to the two plates during the diode soldering operation. The metal plates are constructed from material thin enough that they yield under thermal pressure of the diode to eliminate mechanical strain on the diode during thermal cycling. Backup plates are provided in contact with the diode mounting plates to feed electrical energy thereto.

9 Claims, 7 Drawing Figures

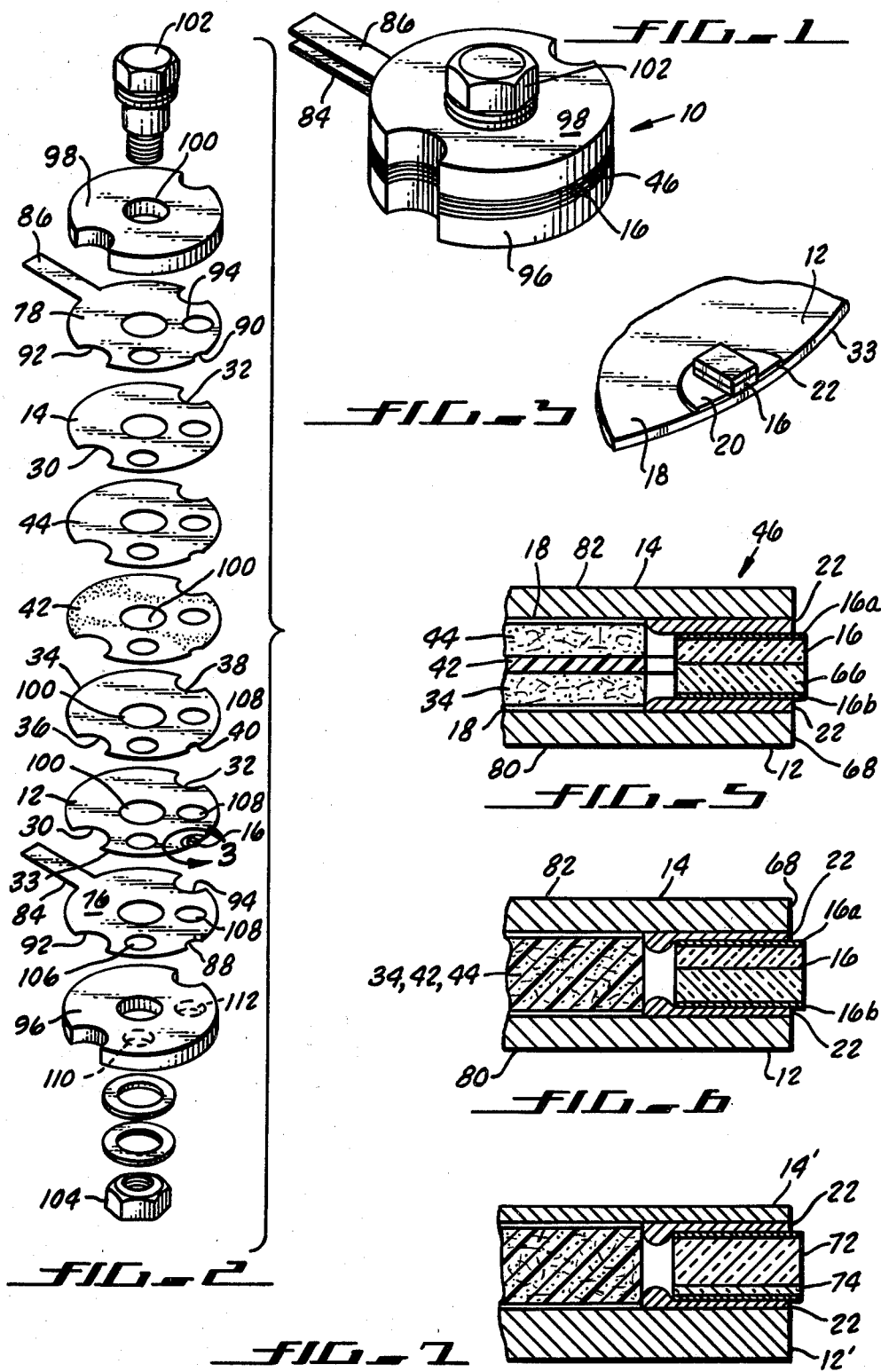

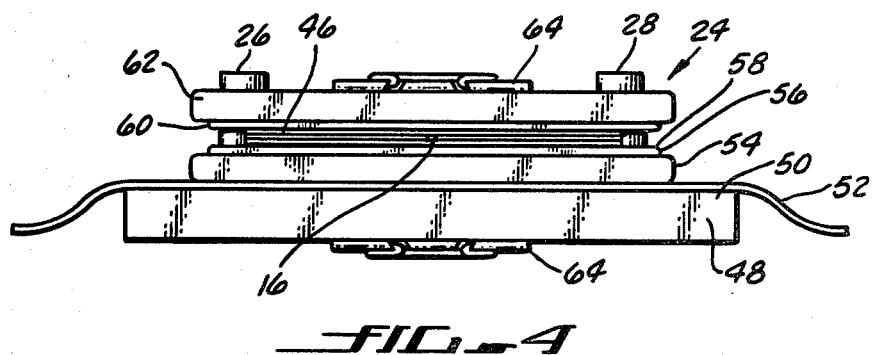
FIG_4

LASER DIODE WITH DOUBLE SIDED HEAT SINK

This is a continuation of application Ser. No. 065,918, filed Aug. 13, 1979, now abandoned.

BACKGROUND OF THE INVENTION

Injection laser diodes are potentially the most efficient narrow band light sources available. Their small size and high brightness makes them ideally suited for applications as sources in ranging illuminators, fiber optics communications, integrated optics and diode pumping of Nd: YAG lasers, particularly for space applications.

The laser cavity in a laser diode is usually formed by two mirrors at the ends of a semiconductor crystal. Semiconductors usually have a high refractive index, particularly for light of photon energies usually involved in such devices, so that a large enough discontinuity exist between the semiconductor and the surrounding air to form mirrors without any coating. Semiconductor crystals cleave along planes of weakest binding so the mirrors are easily constructed to be perpendicular to the junction in a junction laser diode. A small increase in the refractive index exists in the junction area forming a dielectric waveguide that confines the radiation. In the other direction but transverse to the emission direction, small random variations in refractive index confine the radiation and form it into filaments. Stripe geometry laser diodes have an active region that can be limited to a single filament and, therefore, stripe laser diodes have characteristics that can be reproduced more easily.

Semiconductor laser diodes have numerous advantages. They are small. The dimensions of the active regions thereof typically are submicron to a few microns across with the lengthwise dimension usually no more than a fraction of millimeter. The mirrors are an integral part of the crystal structure and usually are formed by cleaving the crystal so they have high mechanical stability. High efficiencies are possible. Pulsed junction laser diodes have been operated at as much as 40% external quantum efficiency. They are versatile. For example, junction laser diodes conventionally are pumped with direct current and their output can be amplitude, frequency, or pulse position modulated into the GHz range. They can lase at wavelengths from 20 to 0.7 microns with the proper choice of semiconductor alloy and can operate in a single mode. They also can be operated continuously at room temperature. Continuous outputs of as much as 40 mW have been obtained at room temperature with much higher powers at lower temperatures.

Their universal application has been restricted, however, because severe problems have plaqued laser diodes users. These problems relate to mounting strain thermal effects caused by the necessarily large heat dissipation per unit area of the diodes, and by the strain induced by thermal cycling. Moreover, laser diode efficiency and device lifetime is markedly decreased by small increases in junction temperature. Effective laser diode use in system applications has required the ability to operate diodes individually or in arrays under optimum and controllable conditions heretofore unavailable. This is because commercially available diodes in arrays use standard headers which neither mechanically yield nor are adaptable for combining matched parameter diodes in high output high density arrays. Lens design and power efficiency in various applications has been difficult because of the less than optimum available mounting configurations. Heretofore available methods for mounting laser diodes do not allow arrays to be built up from selected, parameter matched, quality laser diodes. Overall array efficiency is decreased by this deficiency as much as 50% in output power and with undesirable variations up to 200 Å in optical band width. A short lifetime of some of the diodes can also result. Therefore, in addition to a better and more efficiency mounting arrangement, there has been a need for a mounting arrangement which allows laser injection diodes to be individually mounted and tested and then configured into an array after selection and matching of the various parameters of the diodes.

BRIEF DESCRIPTION OF THE INVENTION

In the present invention each individual semiconductor laser diode is soldered between metal plates for intimate thermal and electrical contact which decreases electrical resistance and increased thermal dissipation. No wire bonds are used. The metal mounting plates are made thin enough to yield with diode thermal expansion, yet thick enough to provide adequate thermal and electrical capacity. The metal plates are held in relative position by a spacer which is firmly adhered to and seals the two plates together during the soldering operation attaching the laser diode to the metal plates. The use of the metal plates results in better and more symmetric heat sinking and smaller thermal strain in the diode than heretofore has been possible to improve the operation thereof. High speed operation is improved by the low resistance and low inductance contacts provided by the metal plates.

The metal plates are electroplated with solder at selected locations using common photoresist techniques. Sheets of fiber spacer and plastic are placed between the plates in the area outside the electroplated solder area. The plastic is selected to melt at the solder melting temperature so that a single thermal cycle can be used to solder the plates to the diode and to seal the plates together. Photoresist left on the plates provides the adherence quality needed for durability. The plate area is made large enough to adequately heat sink the diode and is properly shaped to perform the function of alignment and cooling when placed in an array.

When it is desired to operate a single mounted diode, the assembly formed by the diode and its two heat sink plates is placed between two contact plates which are connected to a source of electrical energy. The contact plates are relieved adjacent the diode to allow thermal expansion. Mounting plates then are placed on the ends of the assembly and an insulated bolt or similar fastener is extended through the assembly to hold it together.

It therefore is an object of the present invention to improve the operation of semiconductor laser diodes by providing intimate heat sink contact on both sides thereof to evenly dissipate the heat generated thereby.

Another object is to provide an assembly for a laser diode which allows the diode to be used individually or in arrays.

Another object is to provide a mounting system for laser diodes which enables the diodes to be operated, tested, and graded prior to assembly into a diode array.

Another object is to provide a mounting system for laser diodes which is relatively economic and easy to manufacture in a production situation.

Another object is to provide an improved process for mounting semiconductor laser diodes.

Another object is to provide a heat sink mounting method for laser diodes which enables the diodes to be operated in an ambient environment or be forcefully cooled through the application of coolant fluids or gases.

Another object is to provide a mounting method for laser diodes which enables operation with an internal etalon for more precise control of their output band width.

These and other objects of the present invention will become apparent to those skilled in the art after considering the following detailed specification which covers preferred embodiments thereof in conjunction with the accompanying drawings wherein:

BRIEF DESCRIPTION OF THE DRAWINGS

FIG. 1 is a perspective view of an assembled laser diode mounting package constructed according to the present invention;

FIG. 2 is an exploded view of the components of FIG. 1;

FIG. 3 is an enlarged detail view of a portion of FIG. 2 encircled at 3;

FIG. 4 is a side view of a fixture in use constructing a heat sinked laser diode assembly;

FIG. 5 is a cross-sectional view through a junction laser diode during its heat sink connection process prior to soldering, with surrounding portions of the heat sink mounting shown;

FIG. 6 is a view similar to FIG. 5 after the application of heat to the assembly; and FIG. 7 is a view similar to FIGS. 5 and 6 of a modified version of the present invention which usually is used with striped laser diodes.

DETAILED DESCRIPTION OF THE SHOWN EMBODIMENTS

Referring to the drawings more particularly by reference numbers, number 10 in FIG. 1 refers to a laser diode package constructed according to the present invention. As shown in FIG. 2, the package 10 includes a pair of laser diode mounting plates 12 and 14 on which the laser diode 16 eventually is attached by its metal contacts 16a and 16b. The plates 12 and 14 are shown similarly shaped in the form of circular discs, however, a plate of any shape can be used. The plates 12 and 14 preferably are constructed from a good heat and electrical conducting material such as copper which has been gold plated on its surfaces to assure good electrical contact. The plates 12 and 14 are coated with photoresist layers 18 except for the diode mounting area 20 which thereafter is coated with indium solder to form a mounting pad 22 (FIG. 3).

When it is desired to mount a diode 16, the plate 12 is placed on a mounting jig 24 (FIG. 4) having two upstanding Teflon coated pins 26 and 28 which fit in indexing cut outs 30 and 32 provided in the edge 33 of the plate 12. The pins 26 and 28 usually are of different diameters which match the shapes of the cutouts 30 and 32. This is done to enable easy electrical orientation of the completed package 10. A plastic filler sheet 34 having indexing cut outs 36 and 38 similar to cut outs 30 and 32 and a diode relief cut out 40 is then placed on the plate 12. This is followed by a fiber spacer 42 and another plastic filler sheet 44 each having the same shape as the filler sheet 34. Polyethylene is a suitable plastic for the filler layers 34 and 44 and lens paper is suitable for the spacer 42. The thicknesses of the filler sheets 34 and 44 and the fiber spacer 42 are chosen to match the thickness of a soldered diode 16. The mounting plate 14 shaped with cut outs 30 and 32 like plate 12, thereafter is placed on the plastic filler 44. The assembly 46 so formed then is heated evenly to simultaneously solder the diode 16 to the metal mounting plates 12 and 14 and to melt the plastic filler layers 34 and 44 into the fiber spacer 42, as shown in FIG. 5. The plastic adheres to the photoresist layers 18 to hold the assembly 46 together.

The jig 24 includes a base plate 48 having a flat surface 50 from which the pins 26 and 28 extend. A heater element 52 is placed on the surface 50 and a pressure plate 54 is placed over the pins 26 and 28 and the heater element 52. The upper surface 56 of the pressure plate 54 is provided with an alumina insulating layer 58 to electrically isolate the heater element 52 from the diode assembly 46 being formed. Thereafter, the metal plates 12 and 14, the plastic filler sheets 34 and 44, and the fiber spacer 42 are stacked as aforesaid with a diode 16 placed on the diode mounting area 20 with its metal contacts 16a and 16b in contact with the solder pads 22. A second alumina layer 60 then is placed on the plate 14 and a pressure plate 62 is placed thereover. The alumina layer 60, like layer 58, is used to electrically isolate the assembly 46 from any current which might escape from the heater element 52. The pins 26 and 28 are Teflon coated to allow easy slipping of the components indexed thereagainst and to provide electrical isolation. Force is applied across the assembly 46 by means such as the spring clip 64 shown. The heater strip 52 thereafter is energized to a temperature level which just causes the plastic filler sheets 34 and 44 and the indium solder pads 22 to melt. The starting and end configurations of this process are shown in FIGS. 5 and 6 respectively. It should be noted that the diode 16 is oriented with respect to the plates 12 and 14 so that its output end 66 extends slightly beyond the edge 68 of the assembly 46. This is to prevent defraction effects from disturbing the output of the diode 16.

A stripe diode 72 mounted in accordance with the present invention is shown in FIG. 7 wherein the lasing junction 74 is substantially closer to one mounting plate 12' than the other 14'. In this instance, it is preferable that the plate 12', which is usually the anode contact for the diode 72, is made thicker than the cathode plate 14 for adequate thermal conduction. Typical thicknesses for the plates 12 and 14 are 0.002 inches whereas plate 12' is 0.003 inches thick and plate 14' is 0.001 inches. Typical thicknesses of the filler sheets 34 and 44 are 0.001 inches while the fiber spacer 32 is typically 0.002 inches. One or more filler sheets 34 and 44 may be used, the number being chosen so that the melted stack of filler sheets and fiber spacers matches the thickness of the soldered diode 16 or 72.

Once the assembly 46 has been formed the diode 16 or 72 can be operated by applying the appropriate electrical current between the mounting plates 12 and 14 or 12' and 14' thereof. When it is desired to utilize a diode in a single diode configuration, backup contact plates 76 and 78 are placed on the outside surfaces 80 and 82 of the plates 12 and 14. The backup contact plates 76 and 78 include electrical connection tangs 84 and 86 and a thermal relief cut out 88 and 90 respectively. The thermal relief cut outs 88 and 90 are ultimately positioned in alignment with the mounting pad areas 20 of the plates 12 and 14 or 12' and 14' so that the plates are free to flex in that area to relieve thermal stresses which otherwise might be applied to the diode. The backup contact plates 76 and 78 have indexing cutouts 92 and 94 so that this alignment can be achieved easily. End caps 96 and 98 having the same general outline as plates 12 and 14 are then placed at the ends of the stack previously described. The end caps 96 and 98 are substantially thicker and stiffer than the other components to provide mechanical rigidity for the mounted diode and additional heat capacity.

All of the elements 12, 14, 34, 42, 44, 76, 78, 96 and 98 previously described have a centrally located hole 100 defined therethrough. An insulated bolt 102 is placed through these holes and is retained therein by a nut 104 to retain the entire assembly 10 together as can be seen in FIG. 1. The elements 12, 14, 34, 42, 44, 76 and 78 also include a pair of cooling holes 106 and 108 adjacent the diode 16. These holes, 106 and 108, can be used to provide passage ways for coolant in either liquid or gaseous form. When this is done, the end caps 96 and 98 are provided with manifolds 110 and 112, shown in dashed outline with respect to cap 96, so that the coolant can be fed therethrough. The coolant holes 106 and 108 are helpful especially when it is desired to place a plurality of assemblies 46 in a diode array which has a high duty cycle and therefore requires positive coolant means.

Thus, there has been shown and described a novel heat sinked laser diode and a process for forming the same, which fulfills all the objects and advantages sought therefore. Many changes, modifications, variations, alterations and other uses and applications of the subject diode and process will become apparent to those skilled in the art after considering this specification and drawings. All such changes, modifications, variations and other uses and applications which do not depart from the spirit and scope of the invention are deemed to be covered by the invention which is limited only by the claims which follow.

What is claimed is:

1. A heat sink mounted laser diode including:
   first and second flat mounting plates of a predetermined outer shape, each mounting plate having a solder pad of predetermined shape thereon, at least one of said mounting plates being relatively thin;
   a laser diode soldered between said first and second mounting plates to said solder pads; and
   a least one flexible, electrically insulating spacer having heat activated adhesive properties positioned between said mounting plates, a predetermined outer shape similar to said predetermined outer shape of said mounting plates and a cutout adjacent said solder pads so said solder pads are not appreciably covered by said spacer, said adhesive retaining said spacer to said mounting plates, the thickness of said diode plus said solder connecting solder pads, and the thickness of said adhesive spacer being equal whereby there is relatively little mechanical strain applied to said diode.

2. The heat sink mounted laser diode as defined in claim 1 wherein said first and second mounting plates are constructed from thin sheets of material having good heat and electrical conducting characteristics, said solder pads and said spacer including different materials that melt at a similar temperature.

3. The heat sink mounted laser diode as defined in claim 2 wherein said laser diode has a front light emitting surface and a rear surface, and said first and second mounting plates have a front edge adjacent said solder pads thereof forming a portion of said outer shape, said laser diode being mounted on said solder pad with a portion thereof including said front light emitting surface extending outwardly beyond said front edge from said first and second mounting plates.

4. The heat sink mounted laser diode as defined in claim 1 wherein said first and second mounting plate and said spacer each include an edge surface thereabout with at least one orienting semicircular cutout therein.

5. The heat sink mounted laser diode as defined in claim 4 wherein said first and second mounting plates and said spacer define a plurality of coolant passageways therethrough adjacent said laser diode.

6. The heat sink mounted laser diode as defined in claim 5 wherein said spacer includes photoresist layers on said first and second mounting plates adjacent said solder mounting pads thereon whereby said photoresist layer improves the adhesive bond of said spacer to said first and second mounting plates.

7. The heat sink mounted laser diode as defined in claim 2 wherein said first and second mounting plates and said spacer define a plurality of coolant passageways therethrough adjacent said laser diode, said heat sink mounted laser diode further including:
   first and second end plates having a similar predetermined outer shape as said mounting plates, said first end plate having a plurality of coolant manifolds in alignment with said plurality of coolant passageways;
   first and second contacts through which electrical energy can be applied to said first and second mounting plates positioned in contact with said first and second mounting plates, said first and second contacts having a similar predetermined outer shape as said mounting plates plus outwardly extending contact tabs; and
   means to hold the assembly so formed together as a unit.

8. The heat sink mounted laser diode as defined in claim 7 wherein said predetermined outer shape of said first and second mounting plates is a circular disc shape having an edge with a pair of semicircular cutouts of different sizes in the edge thereof, a portion of said laser diode extending beyond said edges of said first and second mounting plates.

9. The heat sink mounted laser diode as defined in claim 8 wherein said spacer is constructed from paper and polyethylene plastic.

* * * * *